United States Patent [19]
Kalter et al.

[11] Patent Number: 5,961,653
[45] Date of Patent: Oct. 5, 1999

[54] PROCESSOR BASED BIST FOR AN EMBEDDED MEMORY

[75] Inventors: Howard Leo Kalter, Colchester; John Edward Barth, Jr., Williston; Jeffrey Harris Dreibelbis, Williston; Rex Ngo Kho, Bristol; John Stuart Parenteau, Jr., Enosburg Falls; Donald Lawrence Wheater, Hinesburg, all of Vt.; Yotaro Mori, Yasu Yasu, Japan

[73] Assignee: International Business Machines Corporation, Armonk, N.Y.

[21] Appl. No.: 08/803,053

[22] Filed: Feb. 19, 1997

[51] Int. Cl.[6] .................................................. G06F 11/00
[52] U.S. Cl. ................................ 714/7; 714/30; 714/718; 714/733
[58] Field of Search ...................... 395/182.05, 182.04, 395/182.03, 182.06, 183.05, 183.06, 183.12, 183.18, 185.07; 371/21.1, 22.5, 22.6, 27.1; 365/201, 189.01; 714/7, 6, 5, 8, 30, 36, 42, 718, 733, 734

[56] References Cited

U.S. PATENT DOCUMENTS

| | | |
|---|---|---|
| 4,757,503 | 7/1988 | Hayes et al. .............................. 371/21 |
| 5,138,619 | 8/1992 | Fasang et al. .......................... 371/21.1 |
| 5,258,986 | 11/1993 | Zerbe ....................................... 371/21.2 |
| 5,325,367 | 6/1994 | Dekker et al. .......................... 371/21.1 |
| 5,388,104 | 2/1995 | Shirotori et al. ....................... 371/21.1 |
| 5,557,619 | 9/1996 | Rapoport ................................ 371/22.5 |
| 5,568,437 | 10/1996 | Jamal ..................................... 371/22.31 |
| 5,663,965 | 9/1997 | Seymour ............................... 371/22.31 |
| 5,675,545 | 10/1997 | Madhavan et al. ..................... 365/201 |
| 5,748,640 | 5/1998 | Jiang et al. ............................. 371/21.3 |

*Primary Examiner*—Dieu-Minh T. Le
*Attorney, Agent, or Firm*—Charles W. Peterson, Jr.

[57] ABSTRACT

An integrated chip having a DRAM embedded in logic is tested by an in-situ processor oriented BIST macro. The BIST is provided with two ROMS, one for storing test instructions and a second, which is scannable, that provides sequencing for the test instructions stored in the first ROM, as well as branching and looping capabilities. The BIST macro has, in addition, a redundancy allocation logic section for monitoring failures within the DRAM and for replacing failing word and/or data lines. By stacking the DRAM in 0.5 mb increments up to a 4.0 mb maximum or in 1.0 mb increments up to an 8 mb maximum, all of which are controlled and tested by the BIST macro, a customized chip design with a high level of granularity can be achieved and tailored to specific applications within a larger ASIC.

49 Claims, 10 Drawing Sheets

FIGURE 1

(Prior Art)

PROCESSOR BASED BIST FOR AN EMBEDDED MEMORY

FIELD OF THE INVENTION

The present invention is related to integrated circuit chips and more particularly to a processor based Built-In-Self-Test (BIST) macro to test a Dynamic Random Access Memory (DRAM) embedded in logic.

BACKGROUND OF THE INVENTION

Static Random Access Memories (SRAMs) are known. Logic chips having embedded SRAMs, wherein the memory is formed by cells made of cross-coupled inverters are known. Logic families including SRAMs and BIST macros are also known. Significant advantages are realized by combining logic and memory on the same chip, primarily by avoiding the overhead occurred in communicating between chips. Furthermore, power and space may be reduced and performance significantly improved by providing logic with direct access to an embedded memory. It is a relatively simply matter to include SRAM's in a logic family and, therefore, on chips made from that logic family.

However, DRAMs are another matter. Typically, because of the dichotomy of problems associated with logic versus DRAMs, DRAMs and logic are seldom made on the same manufacturing line, much less combined on the same chip. First, DRAMs require densely packed capacitors with low leakage for storage and, consequently, some form of added processing to create the enhanced capacitor. DRAMs are sensitive to minor defects that do not have a perceptible effect on the logic. Logic often requires extra wiring layers to allow tightly packed logic cells to be interconnected. These are not only unnecessary for DRAMs but, additionally, they could impair the DRAM signal margin and decrease chip yield. Consequently, logic is seldom designed with embedded DRAMs, and DRAMs seldom include significant logic function. BIST logic specifically tests chip function for a limited number of expected results to provide a basic level of confidence to ensure that the chip functions correctly. BIST logic broadly encompasses any function included within a chip (logic or memory).

Another reason DRAM macros are not typically found embedded in logic is that testing a DRAM macro is very complicated. Testing a DRAM chip is in itself a difficult task requiring special test patterns designed to identify specific types of failures, which are eventually combined with specific test voltages and control signal timings. The special test patterns, which include data patterns, address sequencing, timing sequencing change continually as the process goes through changes and matures.

Typical memory BIST techniques employ a state machine wherein the data patterns, address sequencing, control sequence timing are fixed and optimized in the BIST logic. This technique is satisfactory for testing logic and SRAMs. However, it is inadequate for testing DRAMs and especially DRAM macros because of the inflexibility of the BIST logic to cover the data pattern, address sequencing, and control timing sensitivities which can be process or parametric dependent and change with time.

Further, because of DRAM sensitivities to defects, process variations, and other factors that can effect cell signal and functional margins, prior art embedded DRAMs have had fixed images with little or no flexibility built into them. Since each feature (functions, address organization) changes test patterns (data pattern, address sequencing, control timings) that are required and the prediction of how the entire embedded DRAM behaves, prior art embedded DRAMs have been limited to a few basic organizations and then used multiple times with glue logic to create different configurations. Multiple occurrences of the same macro creates the overhead of repeated circuits that can be eliminated with a single embedded DRAM having the desired organization.

Thus, there is a need for a configurable DRAM macro for logic chip designers to select an appropriate configuration without requiring unused, redundant DRAM support circuits. Moreover, there is the need that such a DRAM macro have a flexible BIST that can be externally altered.

OBJECTS OF THE INVENTION

Accordingly, it is the object of the present invention to provide an integrated chip having a DRAM embedded in logic with variable configuration and a BIST macro to provide in-situ test of the functionality of the embedded DRAM at wafer, module, and burn-in.

It is another object of the present invention to make the BIST macro processor oriented.

It is still another object of the present invention to provide the BIST macro with a high degree of flexibility in address sequencing, data patterns, and control timings that test the embedded DRAM.

It is a further object of the present invention to make the BIST macro compatible with Application Specific Integrated Circuit (ASIC) design ground rules and methodology.

It is yet another object of the present invention to have the BIST macro provided with a ROM designed to accept microcode and a scannable ROM for altering, adding, deleting any test instructions stored in the first ROM.

It is still a further object of the present invention to introduce looping as well as changes in sequencing of the test instructions, to provide in-situ characterization and burn-in of the embedded DRAM.

It is a more particular object of the present invention to structure the DRAM as a stack of identical sub-arrays to provide discrete configurability for data width and density to simplify and speed testing.

SUMMARY OF THE INVENTION

In one aspect of the present invention, there is provided a processor based Built-in Self-Test (BIST) macro for testing a memory embedded in logic, which comprises the means for storing test instructions and also the means for reading the test instructions, for generating test patterns from the test instructions, and for sequencing the test instructions.

In another aspect of the invention, there is provided a processor based Built-in Self-Test (BIST) for testing a memory embedded in logic, which includes: a) a clocking means for providing timing; b) the means for storing test instructions; wherein the means for storing the test instructions includes: the first Read-Only-Memory (ROM) means for storing the test instructions; and second ROM means for altering the sequence of the test instructions; c) a processor means for reading said test instructions, d) the means for generating test patterns from the test instructions, e) for sequencing the test instructions; f) the address generation means for generating address schedules for the test instructions; g) data generating means for generating data-input and expected data-output; h) redundancy allocation logic means for monitoring failures within the memory and allocating redundant word lines and data lines to replace the failing word lines and the data lines; i) control means for providing control signals; and j) boundary pipe latch means connected at each input and output of the BIST macro for providing scannable capabilities to the inputs and outputs to improve test coverage.

BRIEF DESCRIPTION OF THE DRAWINGS

The novel features of this invention are set forth in the appended claims. The foregoing and other objects, aspects, and advantages will be better understood from the following detailed description of a preferred embodiment of the invention with reference to the drawings.

DESCRIPTION OF THE PREFERRED EMBODIMENT

Figure 1:
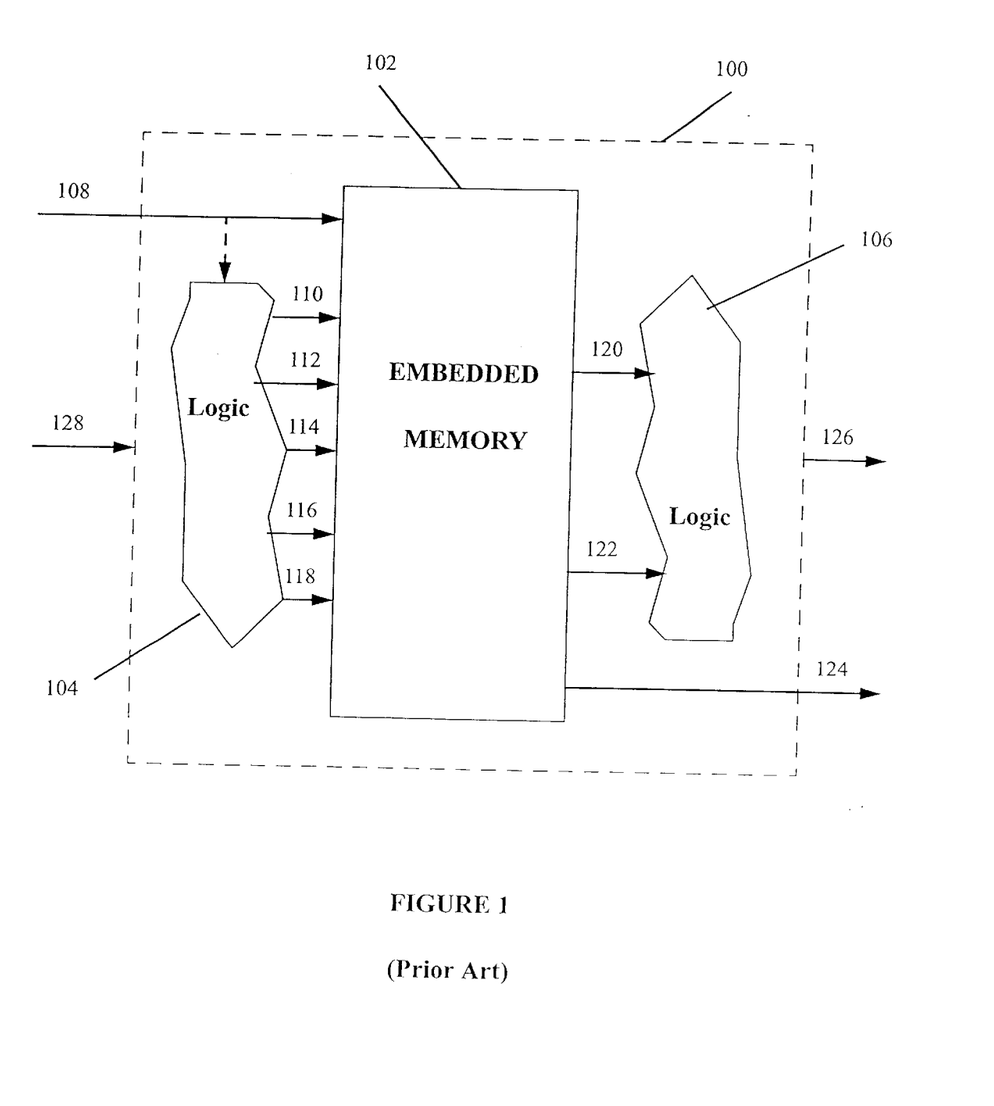
FIG. 1 is a schematic block diagram of a prior art embedded memory.

Referring to FIG. 1, the present invention is preferably embodied in an integrated circuit chip 100 having logic 104 and 106, a DRAM 102 embedded in the logic, and a BIST macro (not shown) for testing the DRAM.

The embedded DRAM is integral to a chip having a logic function, such as a complex gate array or standard cell, a microprocessor, a Digital Signal Processor (DSP), or an Application Specific Integrated Circuit (ASIC). The present invention logic chip may include one or more such embedded DRAMs. Each such DRAM is granular, and may include one or more memory granules or blocks. Two embedded DRAM organizations, a 'by 128' and a 'by 256', are described herein. These two organizations were selected for illustrative purposes only and are not intended to be limitative. By way of example, if parity is desired, these organizations could be 'by 144' or 'by 288', respectively. Further, granularity is achieved, preferably, with a 512 Kb block for the 'by 128' organization, whereas a 1 Mb block is preferable for a 'by 256' organization. Clearly, any convenient block size may be substituted. For optimum performance, refresh interval, macro form factor and size, in the technology used, each embedded DRAM has four column addresses or a column depth of 16 and an appropriate number of word line addresses to a preferred maximum of 2K.

With reference to FIG. 1, scan inputs 108 may pass through the chip logic 104 before being channeled to the embedded DRAM 102, as shown by the dotted line and arrow. The embedded DRAM 102 inputs are: Data Inputs 110 (DI0–DIn), Bit Write Controls 112 (BW0–BWn), Read/Write Controls 114, Address Inputs 116, and Test Controls 118. The embedded DRAM 102 outputs are: data out 120 (DO0–DOn, where n may be the same as for DI) BIST outputs 122; and scan outputs 124. As with the scan inputs 108, the scan outputs 124 may pass through the logic 106 prior to exiting the chip. Although chip primary inputs 128 and primary outputs 126 are not drawn as being directly connected to or through chip logic 104 or 106, it is understood that such connection exists. With a 512 Kb embedded DRAM 102, as shown in FIG. 2a, organized in 256 rows by 16 columns (also referred to as bit lines) by 128 data bits arrangement, or an 8 Mb embedded DRAM 150, as shown in FIG. 2e, organized 2K by 16 by 256 data bits, and surrounded with logic, an ASIC chip, such as represented by chip 100, may provide advantages of lower power, higher performance, and smaller space.

It is understood that, although the embedded DRAM 102 of FIG. 1 is shown surrounded by logic 104 and 106, this is intended for purposes of illustration only. For the purposes of this invention, an embedded DRAM is a dynamic memory block on a logic chip, placed there primarily for use in combination with logic on the chip. It is not intended for use by the logic on other chips having other DRAM chips or other embedded DRAMs, although such incidental use would fall within the spirit of the present invention. As such, by way of example, a microprocessor designed for use in an array of microprocessors with embedded DRAMs working in parallel, falls within the spirit of the invention.

Figure 2A:
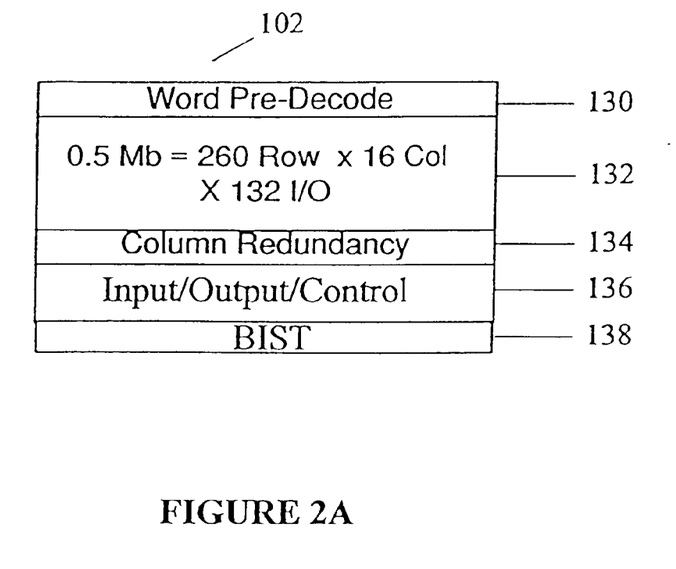
FIGS. 2a–2e show diagrams of the floor plan of various configurations of an embedded DRAM.

FIG. 2a is a diagram of the floor plan of a minimum embedded DRAM 102 according to the present invention, wherein a 128-bit wide embodiment is illustrated. Its description is essentially identical to that applicable to the 256-bit wide architecture in FIG. 2d. The embedded DRAM 102 includes a word address pre-decoder 130, a DRAM cell array 132, a column redundancy block 134, a redundancy allocation logic section 136, and a BIST macro 138.

Figure 2B:
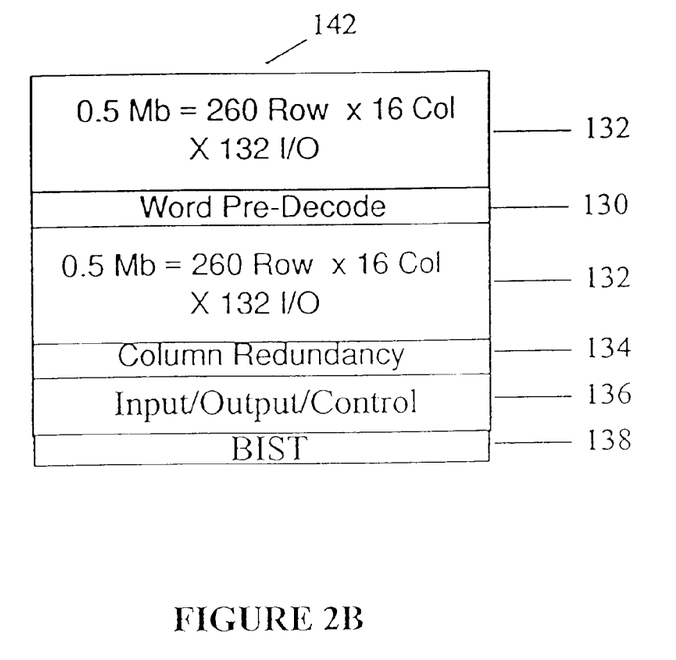
Figure 2C:
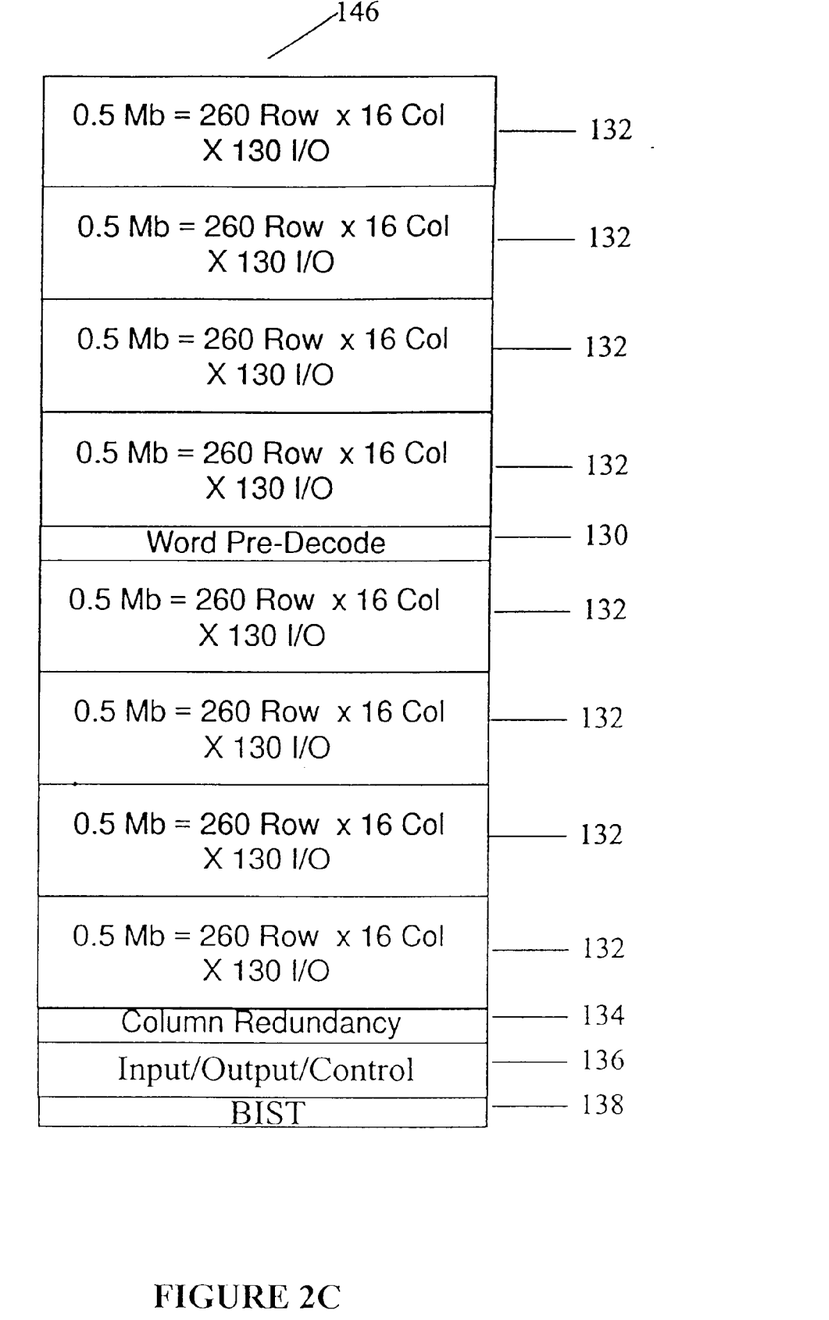
Figure 2D:
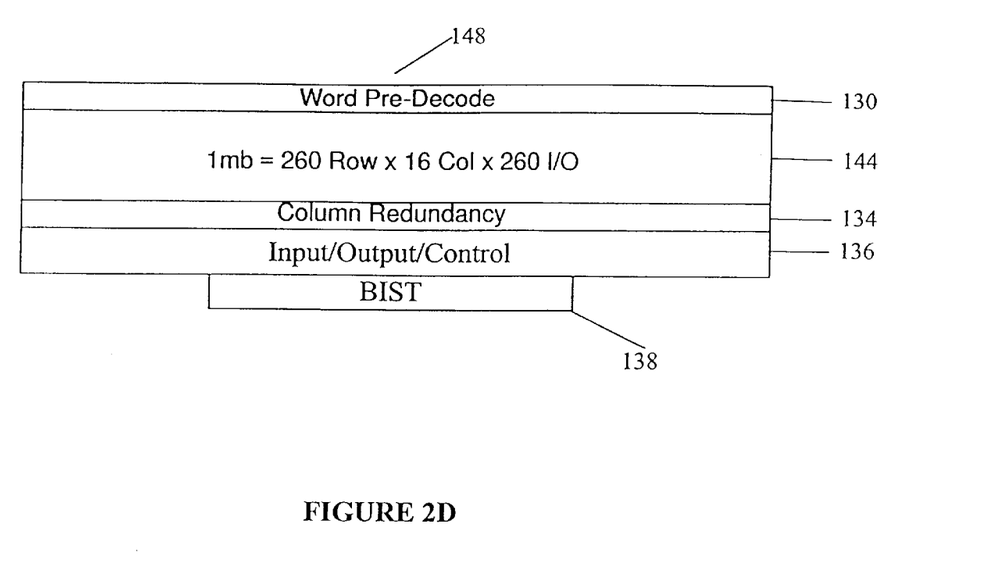
Figure 2E:
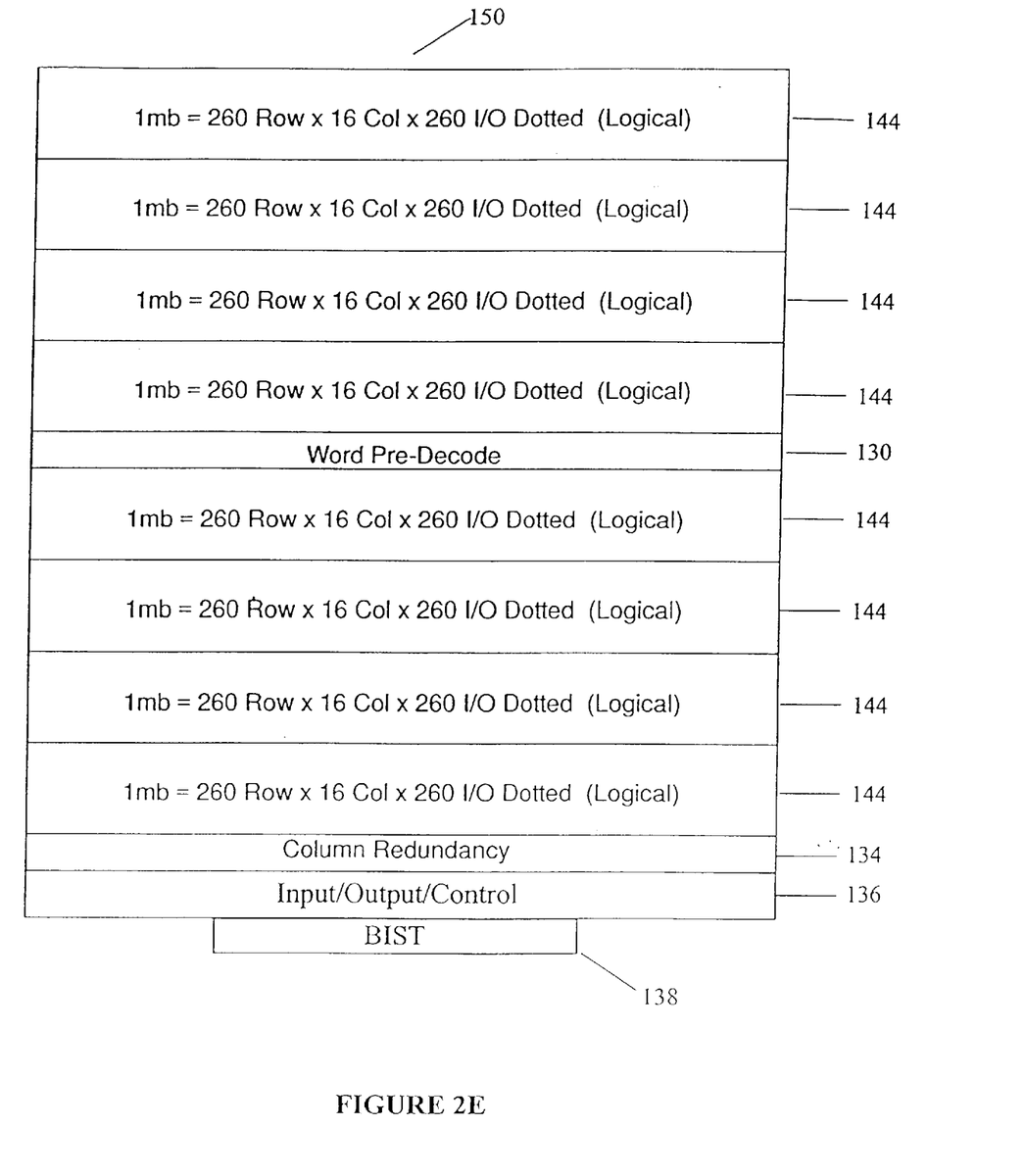

The architecture of the DRAM macro, as shown in FIG. 2a, is expandable, as illustrated in FIGS. 2b–2c for the 'by 128' and FIG. 2d–2e for the 'by 256', and is made possible by the utilization of the four aforementioned basic building blocks. The three blocks that support the cell array sections are designed to account for the largest possible load applicable to the maximum configuration and are appropriately interlocked to ensure proper timing for all configurations that span from the minimum to the maximum configuration.

The one word pre-decoder 130, which is applicable to all three 'by 128' configurations shown in FIGS. 2a–2c, supports up to eight 0.5 Mb cell array blocks, and more specifically, one in FIG. 2a, two in FIG. 2b, and eight in FIG. 2c. Clearly, this design is not limited to a maximum of eight cell arrays. It only serves the purpose of highlighting the embodiment of the present invention, wherein 8 was deemed an optimum maximum number in view of groundrules and technological constraints used in the actual implementation of the present architecture. In the 'by 256' design, the one word pre-decode block would still support up to eight cell array blocks of a 1 Mb size.

The 0.5 Mb DRAM array 132 (FIG. 2a) is the minimum cell array building block for a 'by 128' design. This block contains reference cells, sense amplifiers, digital secondary sense amplifiers, column decoding means, and redundant elements to support the DRAM macro.

The 1.0 mb DRAM array 144 (FIG. 2d) is the minimum cell array building block for a 'by 256' design. This block contains reference cells, sense amplifiers, digital secondary sense amplifiers, column decoding means, and redundant elements to support the DRAM macro.

Referring now to block 134 (FIGS. 2a–2e), the column steering block supports the circuitry required for dynamically inserting a group of spare columns in the presence of a faulty column or group of columns within the cell array.

The block Input/Output/Control 136, applicable to the five FIGS. 2a–2e, contains all the input buffers, output drivers, control logic for the DRAM, bias generators, scannable chains, redundancy allocation logic section and LST's (Logic Service Terminals, i.e., input/output connections to the macro). Finally, BIST 138 is designed to physically match the 'by 128' DRAM width. Its architecture and operation will be explained hereinafter in more detail.

Figure 3:
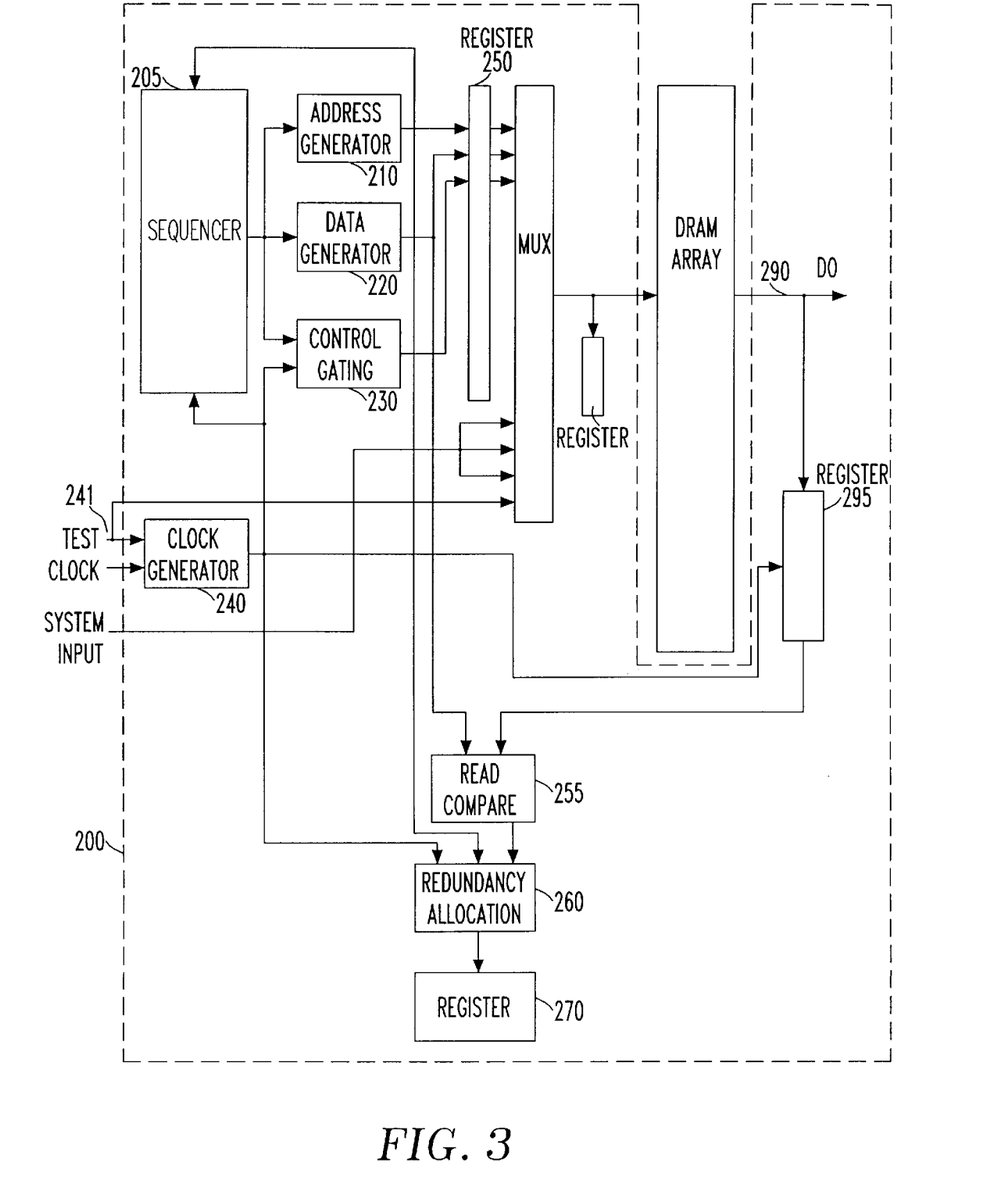
FIG. 3 is a logic block diagram of a BIST macro and its relative positioning with respect to the embedded DRAM.

FIG. 3 is a logic block diagram of the BIST macro 200, according to the present invention, and its relative position with respect to the embedded DRAM. The BIST block is preferably comprised of seven components: a sequencer 205 containing the memory shown in FIG. 4, an address generator 210, a data generator 220, a control block 230, a clock generator 240, a boundary latch pipe stage (shown as register 250), and a two-dimensional redundancy block 260, which will be described hereinafter in more detail with reference to FIG. 6.

The BIST sequencer 205 comprises an 8-bit sequence counter having branch control capabilities. The sequencer is designed to recognize a plurality of branches which include among others, an unconditional branch, conditional branches, branch-on-word or column address conditions, and the like. Additional branches provide loop capabilities within and without a test pattern.

Figure 4:
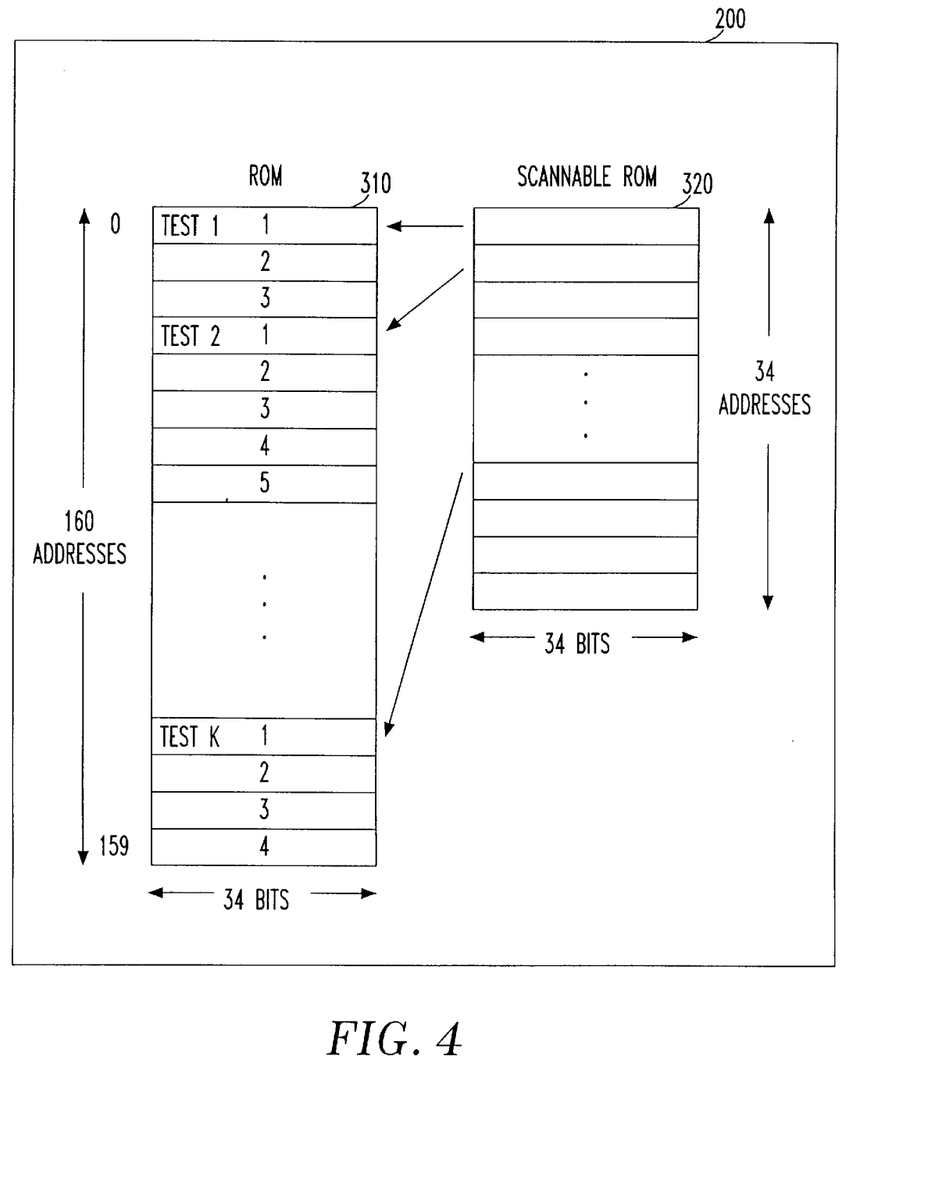
FIG. 4 shows the two ROMs integral to the BIST macro, in accordance with the present invention.

Each sequence address fetches a test word from memory containing the information necessary to identify and execute a set of test instructions which collectively constitute a test pattern. To more thoroughly understand the novel features of the memory contained within the sequencer of the BIST in accordance with the present invention, reference is made to FIG. 4 showing two ROMS. The first ROM 310 is 34 bits wide and is structured to have test instructions written into it in microcode form. Combined sequences of these instructions constructed by the sequencer logic 205 produce typical test patterns, including:

Single address/Ripple word/Physical data/March,

Column disturb addressing/Physical data,

Single address/Page cycle/Ripple column/Logical data,

Multi read/Ripple column/Physical data,

Bit write control/Single cycle/Ripple word/Logical data,

Column disturb addressing/Physical data, etc.

By way of example, referring to the first of the above described patterns, known as a 'Marching 1' test sequence, it is performed in a single access mode (in contradistinction to page access mode), with physical data on each I/O pin. The sequence to practitioners of the art, reads as follows:

|       |           |
|-------|-----------|
| W0    | Increment |
| R0 W1 | Increment |
| R1 W0 | Increment |
| R0 W1 | Decrement |
| R1 W0 | Decrement |

As a second instance, referring to the third of the above listed patterns is performed on a page cycle (i.e., 16 cycles per page), with logical data on all the I/Os. The test sequence reads as follows:

|          |           |
|----------|-----------|
| W0       | Increment |
| R0 W1 R1 | Increment |
| R1 W0 R0 | Increment |
| R0       | Increment |

The base ROM component 310 is preferably configured having 160 addresses by 34 bits wide, allowing for the storage of 5,440 bits. As such, the sequencer addresses to this ROM run from 0 through 159. Such a configuration allows for a total of 160 test instructions, branch statements to be used in conjunction with the instructions and the scannable ROM 320, as well as other miscellaneous parametric tests.

Referring now to the scannable ROM 320 of FIG. 4, it is configured having 34 addresses by 34 bits wide, for a total of 1,156 bits. Preferably, each ROM memory cell is built as a master/slave configuration, typical of scannable designs, such as Level Sensitive Scan Designs (LSSD), and the like. As previously mentioned, in contradistinction to prior art state machines, wherein test patterns are hard coded into the BIST logic and require new photo-lithographic masks to modify, the scannable ROM of the present invention allows for altering, adding, deleting, changing the sequence of any test patterns and more importantly, looping within a single pattern or any group of patterns. This characteristic is particularly relevant for characterization and burn-in testing. The 34 address lines allow for 17 branch instructions which bound the beginning and end of each test pattern produced from first ROM and 17 extra instruction words to accommodate any modifications or changes. The scannable ROM addresses are typically sequenced from 192 through 225. Preferably, the two ROMs 310 and 320 are multiplexed together onto a 34 bit test buss controlled by the sequencer.

Referring back to FIG. 3, the address generator 210 is comprised of three components: a column address counter, a row address counter, and a block address counter, each of which is driven from the test buss to count each cycle. The three components of address generator 210 can be used concurrently to provide address sequences used for test patterns such as: ripple row increment/decrement, ripple column increment/decrement, column disturbs, and the like.

The data generator block 220 of the BIST is responsive to information transmitted by the test buss to create data-in inputs to the macro during BIST write cycles. It also creates comparison data for BIST read cycles, and bit write control inputs for the macro during BIST write cycles. The data-in and expected data-out generators also produce either logical or physical 0/1s, as indicated by the test buss for any given cycle. The data generator also uses complementary data bits from the test buss. This adds to the flexibility of the design by allowing pattern loops to be written when only the read or write data state is changed.

The control gating block 230, under direction of the test buss, gates the control signals to the DRAM that are appropriate for the particular type test pattern and cycle being applied, i.e., single access mode, page mode, refresh, read/write, no-op, etc. A data output strobe, also generated in the control gating block in concert with clock generator 240, is synchronized to the DRAM input control signals. This strobe signal is used in the DRAM during test to accurately measure access time.

The clock generator 240 is used to provide options in shaping the array clocks. The front end of circuit 240 is responsive to the state of the two clock inputs, TSTN0 and TSTN1 241 and a plurality of scan-only latch (not shown) states to provide a plurality of internal systems clock options. These options are, among others: a scan mode for LSSD testing, BIST initialization, shaping of a clock pulse by programming the duty factor during initialization, switching from single access mode to page mode, etc.

The BIST macro is additionally provided with a novel two-dimensional redundancy arrangement represented by blocks 255, 260 and 270 of FIG. 3. This arrangement is designed to fit physically in the layout width of each macro data-out bit. It monitors all the data comparison failures and determines an efficient use of the redundant word lines and data bit elements without requiring a composite bit failure map. Read compare block 255 compares expected values provided by data generator 220 with observed values at the DO output of array 290. These values are stored in output register 295 during test. Appropriate timing for capturing the observed test data is provided by clock generator 240. Redundancy logic block 260, to be described hereinafter, is based on two complete passes through the test sequence at two different voltages, to determine the best possible allocation. Register block 270 stores the results of the redundancy allocation logic and allows scanning the results out to the die pads or to the module pins.

In prior art large memory array architectures, means are commonly provided to repair defective array storage cells. These elements have been practiced in various combinations of spare wordlines (or rows), spare bitlines (or columns), spare data bits and the like. Practitioners of the art will fully realize that many memory array defects can be repaired using a plurality of those redundant elements. However, also well known is the fact that a random allocation approach does not necessarily provide optimum repairability and, thus, optimum yield. The difficulty of establishing the best possible use of available redundancies is typically solved for stand-alone memory dies by using expensive memory testers capable of storing all the memory locations that failed which were observed during testing. This bit fail map data base is used by the tester processor or by a host processor in conjunction with a complex routine that establishes the optimum means required for repairing the array. The two-dimensional redundancy means disclosed in the present invention effectively combines spare word lines and spare data bits. Variations in the selection of alternate means still form part of the embedded, redundancy allocation herein described.

Testing at the die level is preferably done independently on each 1 Mb array (in a 'by 256') and on each 0.5 Mb (in a 'by 128'), with the results scanned-out after completion of each block. The BIST is then reinitialized, and the next 1 Mb (or 0.5 Mb) array is tested. Again, the results are scanned-out and the process is repeated until the entire array macro is fully tested. In this manner, a minimum of on-board latches, and consequently, die area is required for storing the correspondence between array failures and spare elements.

Figure 5:
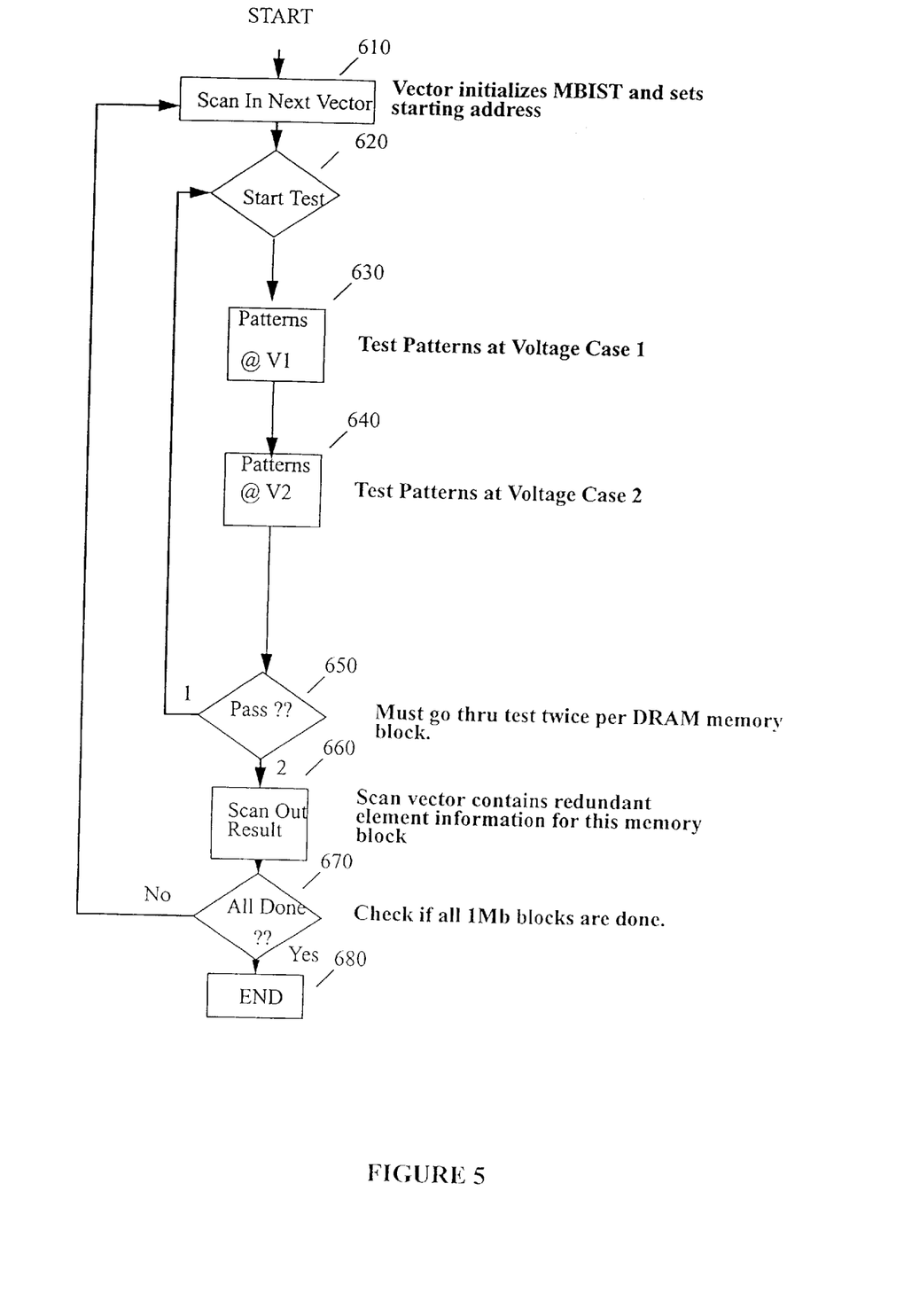
FIG. 5 is a flowchart showing the sequence of steps executed by the BIST macro to implement the two-dimensional redundancy allocation logic for determining the operability of the cell array blocks during wafer, module, and burn-in testing.

Referring now to the test sequence shown in FIG. 5, after initializing all the latches to their initial binary state (610) for a given subset of memory array, the BIST sequence is started (620). All the test patterns are applied to the memory array by the processor-based BIST engine at a plurality of applied voltages. Two such voltages, V1 and V2, are illustrated in the preferred embodiment (630, 640). However, any number of different voltage cases could be implemented.

In the first pass (V1), the two-dimensional redundancy logic 260, to be described hereinafter, determines which failing array elements must use a specific replacement to optimize repairability. Pass 1 (620, 630, 640) is thus used to identify the "must-fix" correspondence between array failures and redundant elements that are to be used to repair those particular failures. This is done to guarantee that the specific spare elements are not first assigned to failures that can be repaired by other redundant elements. Upon completion of Pass 1, a second set of voltages is applied and the process is repeated, as illustrated by 650. Therein, any remaining array failures not requiring a specific replacement are assigned to the remaining plurality of unassigned replacements. The correspondence information relating array failures and spare elements to be used is then scanned-out in a normal LSSD fashion (660). Each subset of the memory array is tested in the same sequence until the complete memory has been tested. This is shown in decision box 670 and completion box 680.

Referring now to the logic description of the two-dimensional redundancy allocation logic in FIG. 6 and the flow diagram in FIG. 7, the redundancy allocation is determined as described below.

Figure 6:
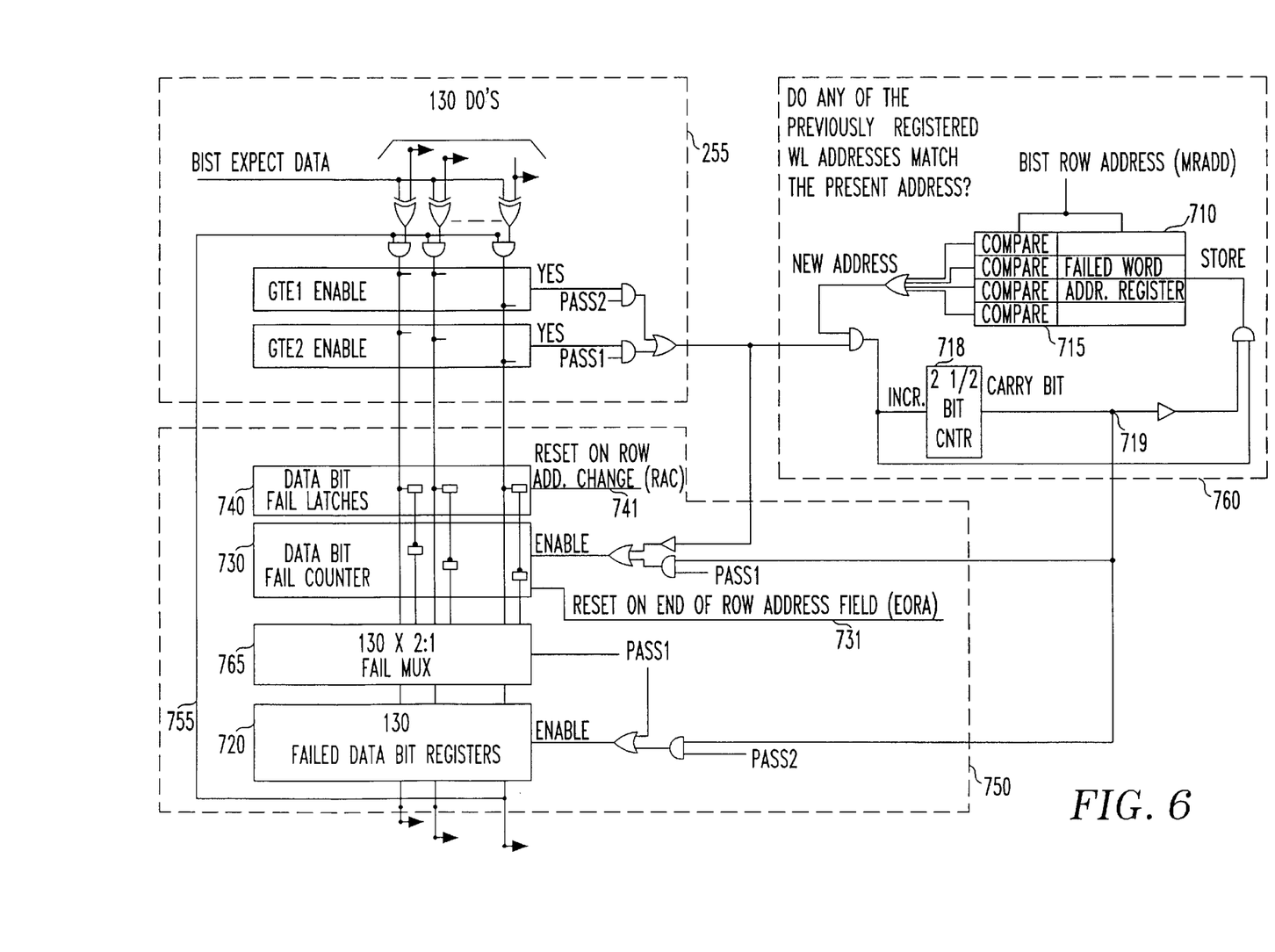
FIG. 6 is a logic block diagram of the two-dimensional redundancy allocation section used for determining the operability of the cell array blocks.
Figure 7:
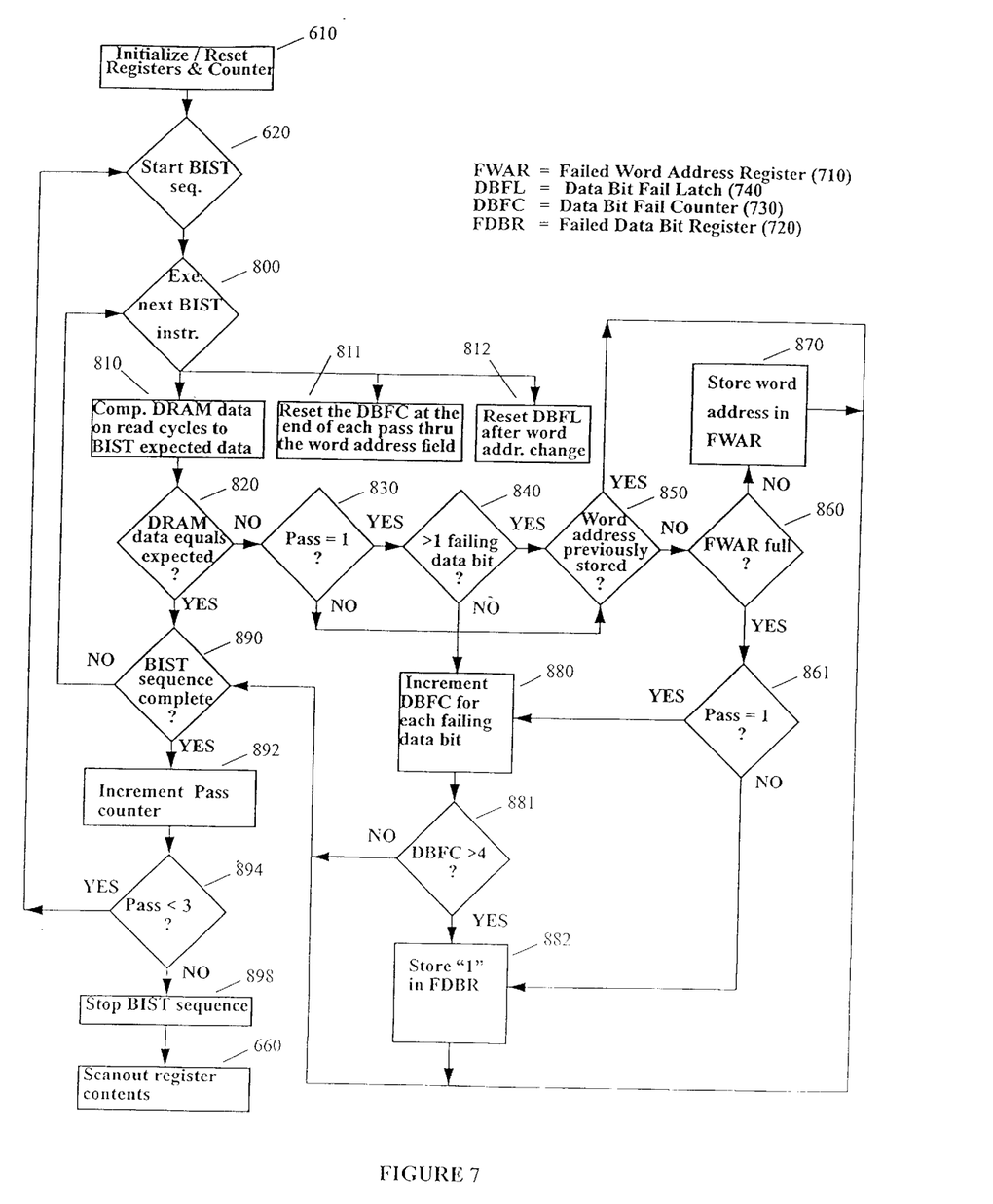
FIG. 7 is a flowchart describing the overall operation of the logic block of the two-dimensional redundancy allocation section in FIG. 6.

The routine, as shown in the flow diagram of FIG. 7, is implemented through on-macro logic represented by the logic block diagram of FIG. 6. As previously explained, the sequence is preferably exercised on each 1 Mb block of array for the 'by 256' memory configuration, or each 0.5 Mb block of array for the 'by 128' configuration. First, the LSSD test vector is scanned in (610), resetting all registers 710, 720, 730 and identifying the address space to be tested. At wafer test, after each respective block of array is tested, the results are scanned out of the LSSD scan chain for interrogation of fixability and fuse blow identification (660). At module level testing, the complete address space of the macro is tested and the results are scanned-out of the LSSD scan chain for interrogation of operability. Module level test can be done in a similar fashion to wafer level test if soft fusing (EEPROM, EPROM, latches and the like) is employed in the macro vs. physical cutting of a fuse after wafer test.

The redundancy allocation logic is comprised of three parts. The first part consists of the Read Compare circuitry 255 of FIGS. 3 and 6. The second and third parts, 260 and 270 of FIG. 3, respectively, make up the logic that determines the optimum correspondence between failing array elements and spare elements to be used for their replacement, and registers to store this correspondence. These two parts are shown in the preferred embodiment of FIG. 6 as 750 and 760, where they have been separated with respect to the two dimensions they represent: the spare data bits and the spare word lines, respectively. Block 750 is referred to as Failed Data Bit circuity and consists of two sets of 130 Failed Data Bit Registers (for a 'by 256') or 66 Failed Data Bit Registers (for a 'by 128') 720 of FIG. 6. Block 760 is referred to as the Failed Wordline Address circuitry. It contains two sets of four 9-bit Failed Word Address Registers 710, shown in FIG. 6.

The Read Compare Circuitry 255 (FIG. 6) compares data read from the memory on each read cycle of the BIST sequence with the expected data for that address. Results of this comparison indicate if any failures have occurred and, further, if more that some predetermined number of fails are present at this address. In the preferred embodiment of FIG. 6, these predetermined fail indicators are "greater than or equal to one" (GTE1) and "greater than or equal to two" (GTE2). These indicators are used by subsequent redundancy logic to determine an optimum assignment of the redundant elements. Also, if a data bit has already been established to be a "must fix" by some previously detected fails, that data bit is no longer compared on future read cycles. This explains the feedback path from the Failed Data Bit Register 755. The Failed Data Bit circuitry 750 consists of a Data Bit Fail Latch 740; a Data Bit Fail Counter 730; a Fail Multiplexer (Mux) 765; and a Failed Data Bit Register 720.

Operation of the Failed Data Bit Circuitry during Pass 1 of the BIST sequence:

If, during a read compare cycle on any memory array address of the BIST sequence, only one data bit is detected as failing, the Data Bit Fail Counter 730 associated with the failing bit is incremented. This is illustrated in the flow chart of FIG. 7 by path 810-820-830-840-880. If more than some predetermined number of data bits fail, e.g., two (in the preferred embodiment of FIG. 6), and the Failed Word Address Register 710 is full, then the Data Bit Fail Counters 730 associated with all failing data bits are incremented. This is shown in FIG. 7 as path 810-820-830-840-850-860-861-880.

If during pass1 of the BIST sequence, the count in the Data Bit Fail Counter 730 exceeds the number of spare word lines available, the Failed Data Bit Register 720 is set to a logic 1 through Fail Mux 765. This is illustrated in the flow chart of FIG. 7 by path 880-881-882. The number of spare word line elements assumed in the preferred embodiment of FIG. 7, is 4. Obviously, this could be changed to any appropriate number from the memory architecture being tested. The Data Bit Fail Latch 740, which controls the incrementing of the Data Bit Fail Counter 730, is preferably implemented in a standard set/reset latch configuration. It is set when a failure in the corresponding data bit is detected and cannot be set again until activated by RAC signal 741. This signal is generated by the BIST engine each time, through the BIST pattern, when the wordline address has changed from the previous read cycle. By using this approach, the Data Bit Fail Counter 730 is not incremented on multiple column address fails on the same word line within the data bit. Similarly, the Data Bit Fail Counter 730 is reset back to 0 each time the BIST engine reports that an entire pass through the word address field has completed, setting up a flag identified as signal 731. This ensures that the same failing array addresses will not increment the counter and cause a Failed Data Bit to be stored or forced into repetitive excursions through the word address field for address incrementing and decrementing. The above two operations are identified by boxes 811 and 812 of FIG. 7.

Operation of the Failed Data Bit Circuitry during Pass2 of the BIST sequence:

During Pass2, the Fail Mux 765 ignores the count in the Data Bit Fail Counter 730 and stores a logic 1 in the Failed Data Bit Register each time a "full" Failed Word Address Register 710 is detected. This is represented by the path 810-820-830-850-860-861-882 (FIG. 7). Explanation of the Failed Word Address Register is given hereinafter.

Operation of the Failed Wordline Address Circuitry during Pass1 of the BIST sequence:

The Failed Wordline Address Circuitry 760 consists of a Failed Word Address Register 710; a Failed Word Address Comparator 715; and a Failed Word Address Counter 718.

If, during any read compare cycle on any memory array address of the BIST sequence, there is more than a predetermined number of data bits detected as failing, i.e., 2, in the preferred embodiment of FIG. 6, the address of the wordline during that read cycle is stored in the Failed Word Address Register 710, assuming that particular wordline address has not been stored previously, and that the Failed Word Address Register 710 is not already full. The logic associated with the Failed Word Address Register 710 determines these two conditions and correctly orchestrates the writing of register 710. The Failed Word Address Counter 718 is also incremented each time a new address is stored so that the status of unassigned spare word line elements is always available to the allocation logic on circuit node 719 (the Carry Bit). This operation is represented in FIG. 7 by path 810-820-830-840-850-860-870. If the wordline address being read has already been stored, the fail on this cycle is simply ignored since it already has its correspondence to a spare element. This condition follows path 810-820-830-840-850-890 in FIG. 7. If the Failed Address Register 710 is full, as determined by a logic 1 on Carry Bit 719 and is, thus, unable to store any further failing word line addresses, the Data Bit Fail Counter 730, is incremented on each associated data bit that is failing. Here the path 810-820-830-840-850-860-861-880 of FIG. 7 is followed.

Operation of the Failed Wordline Address Circuitry during Pass2 of the BIST sequence:

During Pass2, any detected fails, regardless of how many data bits are failing, will have their wordline address stored in any remaining registers in the Failed Word Address Register 710. This path followed herein is 810-820-830-850-860-861-882 shown in FIG. 7.

When the BIST sequence is complete, the path has progressed through 890-892-894-898, the contents of the Failed Data Bit Registers 720 and the Failed Word Address Registers 710 are scanned-out in normal LSSD fashion to reveal the required redundant element activation 660, shown in FIG. 7.

The boundary latch pipe stage 250 of FIG. 3, is the final stage of the BIST engine logic before buffering all the outputs from the BIST macro. Preferably, it is a master/slave latch attached to each output, thereby adding a pipeline stage to the BIST macro. This latch set also serves to provide boundary scan provisions for the BIST engine, thereby improving the overall test coverage. The latches comprising stage 250 may be advantageously connected to form a shift-register, to allow the register to scan-in and scan-out DRAM control inputs.

By placing stage 250 as stated, it relieves the performance requirements of the BIST memory to equal the fastest required cycle. Otherwise, memory fetches would be in-stream with the test buss output and would have had to be much faster to meet minimum page mode cycle time requirements.

While the invention has been described in terms of a specific embodiment, it is evident in view of the foregoing description that other alternatives, modifications, and variations will be apparent to those skilled in the state of the art. Thus, the invention is intended to encompass all such alternatives, modifications, and variations which fall within the scope and spirit of the invention and appended claims.

What is claimed is:

1. A processor based Built-in Self-Test (BIST) macro for testing a memory embedded in logic, comprising:

an instruction storage storing test instructions for testing at least one memory array;

a programmable processor reading said test instructions, generating test patterns in response to said test instructions, and sequencing said test instructions, said test patterns testing each said memory array; and must fix logic accumulating failing memory addresses for each said tested memory array and identifying elements of having multiple failures, addresses of said identified elements being must fix addresses.

2. The processor based Built-in Self-Test Macro as recited in claim 1, further comprising redundancy allocation logic monitoring failures and must fix addresses within said each memory array and allocating redundant said memory elements to replace detected failures and identified must fix addresses, wherein said redundant memory elements includes word lines and data lines.

3. The processor based Built-in Self-Test Macro as recited in claim 2, wherein said redundancy allocation logic means further comprises a read compare circuit, a failed word address circuit and a failed data bit circuit.

4. The processor based Built-in Self-Test Macro as recited in claim 1, wherein said instruction storage further comprises:
   a first Read-Only-Memory (ROM) storing said test instructions; and a second ROM, the sequence of said test instructions being altered responsive to said second ROM.

5. The processor based Built-in Self-Test Macro as recited in claim 4, wherein the said second ROM is scannable.

6. The Processor based Built-in Self-Test Macro as recited in claim 4, wherein the content of said test instructions are altered responsive to the second ROM.

7. The processor based Built-in Self-Test Macro as recited in claim 4, wherein outputs of said first ROM and said second ROM are multiplexed.

8. The processor based Built-in Self-Test Macro as recited in claim 1, wherein said memory array is a DRAM array.

9. The processor based Built-in Self-Test Macro as recited in claim 1, wherein said memory array is an SRAM array.

10. The processor based Built-in Self-Test Macro as recited in claim 1, further comprising an address generator providing memory array address schedules for said test instructions.

11. The processor based Built-in Self-Test Macro as recited in claim 1, wherein said generated test patterns are selected from the group consisting of: ripple row increment-decrement patterns, ripple column increment-decrement patterns, diagonal patterns, and column disturb patterns.

12. The processor based Built-in Self-Test Macro as recited in claim 10, wherein said address generator comprises:
   a block address counter selecting one said at least one memory array;
   a column address counter selecting an array column; and
   a row address counter selecting an array row.

13. The processor based Built-in Self-Test Macro as recited in claim 1, further comprising a boundary latch stage buffering output signals in a scan mode.

14. The processor based Built-in Self-Test Macro as recited in claim 13, wherein said boundary latch stage is comprised of master-slave latches connected in a shift-register arrangement.

15. The processor based Built-in Self-Test Macro as recited in claim 14, wherein said boundary latch stage is a scannable shift-register.

16. The processor based Built-in Self-Test Macro as recited in claim 15, wherein said scannable shift register is a Level-Sensitive-Scan-Design register.

17. The processor based Built-in Self-Test Macro as recited in claim 1, further comprising a data generator generating data-in inputs of said memory and expected data-out outputs of said memory.

18. The processor based Built-in Self-Test Macro as recited in claim 1, wherein said data generator generates logical and physical binary data.

19. The processor based Built-in Self-Test Macro as recited in claim 1, further comprising: a clock generator providing said BIST macro and each said at least one memory array with timing signals.

20. The processor based Built-in Self-Test Macro as recited in claim 19, wherein said clock generator shapes said timing signals.

21. The processor based Built-in Self-Test Macro as recited in claim 1, wherein said at least one memory array is a plurality of 1 Mb memory arrays arranged in a 'by 256' array configuration and a plurality of 0.5 Mb memory arrays arranged in a 'by 128' configuration.

22. The processor based Built-in Self-Test Macro as recited in claim 21, wherein said plurality of 1 Mb arrays and said plurality of said 0.5 Mb are controlled by a pre-decoder circuit.

23. The processor based Built-in Self-Test Macro as recited in claim 1, further comprising: a boundary latch pipe comprised of boundary scan latches coupled to inputs and outputs of the BIST macro, said boundary latch pipe improving test coverage when scanning said latches.

24. The processor based Built-in Self-Test (BIST) Macro for testing a memory embedded in logic, comprising:
   a clock circuit providing timing signals;
   an instruction storage storing test instructions for testing at least one memory array;
   a programmable processor reading said test instructions, generating test patterns in response to read said test instructions, and sequencing said test instructions;
   an address generator generating address schedules for said test instructions;
   a data generator generating data-input to a tested one of said at least one memory array and expected data-output from said tested memory array;
   redundancy allocation logic monitoring and identifying failures within said tested memory array and allocating redundant word lines and data lines to replace identified failing said word lines and said data lines;
   a control circuit providing control signals to control testing said tested memory array responsive to said timing signals and said test instruction;
   a boundary pipe latch stage connected at each input and output of said BIST macro and providing scannable capabilities to said inputs and outputs to improve test coverage; and
   wherein said instructions storage comprises:
      a first Read-Only-Memory (ROM) storing said test instructions; and
      a second ROM controlling and altering the execution sequence of said test instructions.

25. The processor based Built-in Self-Test Macro as recited in claim 24, wherein said boundary pipe latch stage is comprised of master-slave latches connected in a shift-register arrangement.

26. The processor based Built-in Self-Test Macro as recited in claim 24, wherein said boundary pipe latch stage is a scannable shift-register.

27. The processor based Built-in Self-Test Macro as recited in claim 26, wherein said scannable shift-register is a Level-Sensitive-Scan-Design register.

28. The processor based Built-in Self-Test Macro as recited in claim 24, wherein said second ROM is scannable.

29. The processor based Built-in Self-Test Macro as recited in claim 24, wherein said first ROM and second ROM are multiplexed.

30. The processor based Built-in Self-Test Macro as recited in claim 24, wherein said address generator comprises:
   a block address counter providing an address of one said at least one memory array;
   a column address counter providing an array column address; and a row address counter providing an array row address.

31. The processor based Built-in Self-Test Macro as recited in claim 24, wherein said redundancy allocation logic further comprises:
   a read compare circuit;
   a failed word address circuit; and
   a failed data bit circuit.

32. The processor based Built-in Self-Test Macro as recited in claim 24, wherein said redundancy allocation logic further comprises read compare circuit means, failed word address circuit means and failed data bit circuit means.

33. The processor based Built-in Self-Test Macro as recited in claim 24, wherein said at least one memory array is a plurality of 1 Mb arrays in a 'by 256' array configuration and a plurality of 0.5 Mb arrays in a by 128' array configuration.

34. The processor based Built-in Self-Test Macro as recited in claim 24, wherein a plurality of said 1 Mb arrays and a plurality of 0.5 Mb arrays are controlled by a pre-decoder circuit.

35. The processor based Built-in Self-Test Macro as recited in claim 24, wherein a master-slave latch is connected to each output of said BIST macro.

36. A redundancy allocation logic circuit for monitoring failures within a memory embedded in logic, said memory being provided with redundant word lines and data lines said redundancy allocation logic circuit replacing monitored said failures with said word lines and said data lines, said circuit comprising:
   means for determining a presence of failures in word lines or data lines of a memory array;
   means for storing a line address of said determined failures;
   means for determining a 'greater than' predetermined number of said failures occurring at one or more said line address; and
   means for optimizing allocation of redundant word lines and redundant data lines, thereby maximizing a probability of repairing said failures within an embedded memory.

37. An integrated chip comprising:
   a plurality of stackable arrays forming a DRAM, said DRAM being embedded in logic;
   a decoder decoding addresses for each of said stackable arrays;
   an instructions storage storing test instructions for testing each of said stackable arrays;
   a programmable processor reading said test instructions, generating test patterns responsive to said test instructions, and sequencing said test instructions; and
   redundancy allocation logic monitoring and identifying failures within said DRAM, accumulating failing memory addresses for each said tested memory array identifying elements having multiple failures addresses of said identified elements being must fix addresses and allocating redundant word lines and data lines to replace identified failing lines.

38. In a logic integrated circuit (IC) chip, stackable arrays forming a modular DRAM, said DRAM being embedded in said logic, said DRAM being provided with redundant word lines and redundant data lines, said DRAM comprising:
   a processor based BIST circuit for testing said DRAM;
   redundancy allocation logic for monitoring failures within said DRAM and for allocating said redundant work lines and data lines for replacing failing said lines and further comprising:
      a data comparator comparing observed data at outputs of said DRAM to expected data,
      a 'greater than' enabling circuit identifying 'a must fix' word line responsive to results from said data comparator,
      a word address resister storing identified failing said word line addresses said word address register comprising a word address comparator comparing a previously stored said failing word address to a current said failing word address, wherein said current failing word address is stored in said word address register if it was not previously stored therein and further allocating a redundant word line to replace said failing word line at said failing stored address; and
   a pre-decoder determining a configuration of said plurality of stackable arrays.

39. The DRAM as recited in claim 38, wherein said 'greater than' enabling circuit further identifies a 'must fix'0 data line redundancy.

40. The DRAM as recited in claim 39, wherein the address of said 'must fix' bit is stored in a register, and said address of said bit is sent to a fuser, said fuser blowing a fuse on said IC chip.

41. A method of testing a semiconductor structure, said semiconductor structure including an integrated circuit chip, said integrated circuit chip including a programmable processor, a memory array, an instruction storage, a comparator and a redundancy repair circuit, said method comprising:
   a) presenting a test instruction from said instruction storage to said programmable processor;
   b) providing a test pattern to a memory array responsive to said presented test instruction;
   c) comparing in said comparator results of said provided test pattern against an expected result;
   d) storing an address for each failing said result and identifying must fail addresses by:
      i) accumulating failing memory addresses, and
      ii) identifying elements of a first type having multiple failures. addresses of said identified elements being must fix addresses; and
   e) repeating a–d until all memory locations have been tested.

42. The method of claim 41 further comprising the step of:
   f) replacing a memory array element with a redundant element responsive to each must fix address.

43. The method of claim 42 wherein at least one replaced element is a word line.

44. The method of claim 42 wherein at least one replaced element is a column line.

45. The method of claim 41 wherein the memory array is embedded in logic on said chip.

46. The method of claim 45 wherein the memory array is a plurality of memory arrays embedded in logic on said chip.

47. The method of claim 42 wherein the redundant element is replaced by blowing one or more fuses to select a replacement memory element.

48. The method of claim 41 wherein additional must fix addresses are identified by identifying elements of a second type having multiple failures, addresses of said identified elements of said second type being must fix addresses.

49. The method of claim 41 wherein elements of said first type are word lines and elements of said second type are column lines.

* * * * *